(12) United States Patent
Snure et al.

(10) Patent No.: US 10,858,253 B2
(45) Date of Patent: Dec. 8, 2020

(54) METHOD AND APPARATUS FOR PRODUCING A NANOMETER THICK FILM OF BLACK PHOSPHORUS

(71) Applicant: Government of the United States, as represented by the Secretary of the Air Force, Wright-Patterson AFB, OH (US)

(72) Inventors: Michael R. Snure, Dayton, OH (US); David Weyburne, Maynard, MA (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 138 days.

(21) Appl. No.: 16/232,425

(22) Filed: Dec. 26, 2018

(65) Prior Publication Data

US 2020/0207623 A1    Jul. 2, 2020

(51) Int. Cl.
| C01B 25/02 | (2006.01) |
| C23C 14/06 | (2006.01) |
| H01L 31/0264 | (2006.01) |

(52) U.S. Cl.
CPC .............. C01B 25/02 (2013.01); C23C 14/06 (2013.01); H01L 31/0264 (2013.01)

(58) Field of Classification Search
CPC ...... C01B 25/02; C23C 14/06; H01L 31/0264
See application file for complete search history.

(56) References Cited

U.S. PATENT DOCUMENTS

| 6,020,253 A | 2/2000 | Gedridge, Jr. et al. |
| 6,110,438 A | 8/2000 | Baillargeon et al. |

(Continued)

FOREIGN PATENT DOCUMENTS

| CN | 107447193 A | 12/2017 |
| WO | 2017166878 A1 | 10/2017 |

OTHER PUBLICATIONS

Li et al., "Effects of Al2O3 capping layers on the thermal properties of thin black phosphorus," Applied Physics Letters 109, 261901 (2016) (Year: 2016).*

(Continued)

*Primary Examiner* — Anthony J Zimmer
(74) *Attorney, Agent, or Firm* — AFMCLO/JAZ; Jeffrey V. Bamber

(57) ABSTRACT

A low pressure process for producing thin film crystalline black phosphorus on a substrate and a black phosphorus thin film made by the process. The process includes flowing a phosphorus-containing gas into a deposition chamber and depositing phosphorus from the phosphorus-containing gas onto the substrate in the chamber. The substrate is selected from (i) a gold substrate, a gold-tin alloy substrate, a silver substrate and a copper substrate and (ii) a substrate comprising a thin film of metal selected from gold, tin, silver, copper and alloys of the foregoing metals. The substrate and phosphorus are heated to a temperature ranging from about 350° to less than about 500° C. to form a phosphorus intermediate composition. The substrate and intermediate composition are heated to a temperature of greater than 500° C. to less than about 1000° C. convert the metal phosphorus intermediate composition to the black phosphorus thin film.

13 Claims, 3 Drawing Sheets

(56) References Cited

U.S. PATENT DOCUMENTS

2016/0225641 A1     8/2016   Bedell et al.
2018/0138039 A1     5/2018   Kwon et al.
2018/0294156 A1*   10/2018   Xia ................... H01L 21/6835

OTHER PUBLICATIONS

Li, X.; Deng, B.; Wang, X.; Chen, S.; Vaisman, M.; Kurato, S.; Pan, G.; Lee, M.L.; Cha, J.; Wang,H.; Xia, F.; "Synthesis of thin-film black phosphorus on a flexible substrate," Dept. of Elec. Eng. Yale Univeristy, New Haven, CT, 2015, pp. 1-16.
Veeco Instruments, Inc., "Advances in Phosphorus Valved Cracker Technology," Application Note, Note No. 2/97, May 1997, pp. 1-4.

* cited by examiner

METHOD AND APPARATUS FOR PRODUCING A NANOMETER THICK FILM OF BLACK PHOSPHORUS

RIGHTS OF THE GOVERNMENT

The invention described herein may be manufactured and used by or for the Government of the United States for all governmental purposes without the payment of any royalty.

TECHNICAL FIELD

The present invention is directed to a method and apparatus for producing black phosphorus and in particular, for producing a thin film crystalline black phosphorus on a substrate using a vaporous phosphorus source.

BACKGROUND

Black phosphorus is a promising semiconductor material with many exceptional physical properties, including, but not limited to, high hole mobility, thickness tunable band gap, and an anisotropic transport making it suitable for numerous electronic and opto-electronic applications. Phosphorus has three main allotropes, i.e., white, red and black. Among these allotropes, black phosphorus is thermodynamically the most stable, is insoluble in most solvents, is practically non-flammable, and is chemically the least reactive. Black phosphorus exists in three known crystalline structures, namely, orthorhombic, rhombohedral, and simple cubic, as well as in an amorphous form. Very thin films of one to a few monolayers of ambient stable orthorhombic black phosphorus is an analogue of graphene. Such thin film black phosphorus, sometimes referred to as phosphorene, has been shown to have excellent electronic and optical properties Black phosphorus has been synthesized in bulk form for more than 100 years through high temperature and pressure conversion from the more common white or red phosphorus allotropes. Most device work to date has used submicron sized black phosphorus flakes exfoliated from bulk black phosphorus sources due to a lack of suitable method for preparing thin film samples of black phosphorus. In order to produce crystalline samples of black phosphorus with a large grain size, pressures in excess of 10 kbar and temperature in excess of 600° C. are required. Crystalline films of black phosphorus have been produced through high pressure and high temperature conversion of red phosphorus films on substrates up to 4 millimeters in diameter. However, a disadvantage of producing black phosphorus from red phosphorus films is that the yield of black phosphorus is extremely low resulting in quantities of black phosphorus thin films that cannot be used for practical electronic applications. What is needed, however, are crystalline thin films of black phosphorus having areas of several centimeters squared for use in commercial electronic applications.

SUMMARY OF THE DISCLOSED EMBODIMENTS

In view of the foregoing the invention provides a low pressure process for producing thin film crystalline black phosphorus on a substrate and an orthorhombic black phosphorus thin film made by the process. The process includes flowing a phosphorus-containing gas into a deposition chamber and depositing phosphorus from the phosphorus-containing gas onto the substrate in the deposition chamber. The substrate is selected from (i) a gold substrate, a gold-tin alloy substrate, a silver substrate and a copper substrate and (ii) a substrate comprising a thin film of metal selected from gold, tin, silver, copper and alloys of the foregoing metals. The substrate and phosphorus are heated to a temperature ranging from about 350° to less than about 500° C. to form a phosphorus intermediate composition. The substrate and phosphorus intermediate composition are heated to a temperature of greater than 500° C. to less than about 1000° C. convert the phosphorus intermediate composition to an orthorhombic black phosphorus thin film on the substrate.

In another embodiment there is provided a low pressure process for producing thin film crystalline black phosphorus on a substrate. The process includes depositing a metal phosphide on the substrate in a deposition chamber, wherein the metal phosphide is deposited using a process selected from the group consisting of evaporation, chemical vapor deposition and sputtering and wherein the metal is selected from gold, tin, silver, copper and alloys of the foregoing metals. The metal phosphide is then heated to a temperature of from above 500° C. to less than about 1000° C. to form thin film black phosphorus on the metal.

A further embodiment of the invention provides a low pressure process for producing thin film crystalline black phosphorus on a substrate. The process includes heating the substrate to a temperature ranging from about 300° to about 500° C. in a deposition chamber. A phosphorus-containing gas is generated from a phosphorus source and flowed into the deposition chamber to form a layer on the substrate. A capping material is placed on the phosphorus layer. The phosphorus layer is then heated to a temperature from above about 500° C. to less than about 1000° C. convert the phosphorus layer to an orthorhombic black phosphorus thin film on the substrate.

Yet another embodiment of the invention provides an orthorhombic black phosphorus thin film made by a low pressure process. The process includes the steps of flowing a phosphorus-containing gas into a deposition chamber, depositing phosphorus from the phosphorus-containing gas onto a substrate in the deposition chamber, wherein the substrate is selected from (i) a gold substrate, a gold-tin alloy substrate, a silver substrate and a copper substrate and (ii) a substrate comprising a thin film of metal selected from the group consisting of gold, gold-tin alloy, silver and copper. The substrate and phosphorus are heated to a temperature ranging from about 350° to less than about 500° C. to form a phosphorus intermediate composition. The phosphorus intermediate composition is then heated to a temperature of greater than 500° C. to less than about 1000° C. convert the phosphorus intermediate composition to an orthorhombic black phosphorus thin film having a thickness ranging from about 1 to about 500 nanometers on the substrate.

In some embodiments of the invention, the deposition chamber is a chemical vapor deposition chamber.

In other embodiment of the invention, the phosphorus-containing gas is derived from the group consisting of red phosphorus, violet phosphorus, phosphine, alkyl-phosphine. In some embodiments, the phosphorus containing gas is a di-phosphorus vapor.

In other embodiments of the invention the substrate is selected from a gold foil, a gold-tin alloy foil, and an insulating substrate containing a thin film layer of gold or gold-tin alloy.

In some embodiments of the invention, the phosphorus intermediate composition is selected from the group consisting of $Au_2P_3$, $Au_3SnP_7$, $Au_7IP_{10}$, $AgP_2$, $CuP_2$.

In other embodiments of the invention the process further comprises capping the phosphorus intermediate composition after the deposition step and prior to heating the substrate and phosphorus intermediate composition to a temperature of greater than 500° C. to less than about 1000° C. in the presence of $PH_3$ and $H_2$. In some embodiments, the capping material is selected from sapphire, quartz, glass, silicon, $Al_2O_3$, $HfO_2$, and $SiO_2$.

An advantage of the disclosed embodiments is that it provides a low pressure, low temperature process for producing relatively large thin film deposits of crystalline black phosphorus on a substrate. By "low pressure" means a pressure of from about atmospheric pressure to about 100 mTorr or lower. By "low temperature" means a temperature ranging from about 300° to less than about 1000° C. By "relatively large" means thin films having areas greater than about 1 cm².

DETAILED DESCRIPTION OF THE EMBODIMENTS

Figure 1:
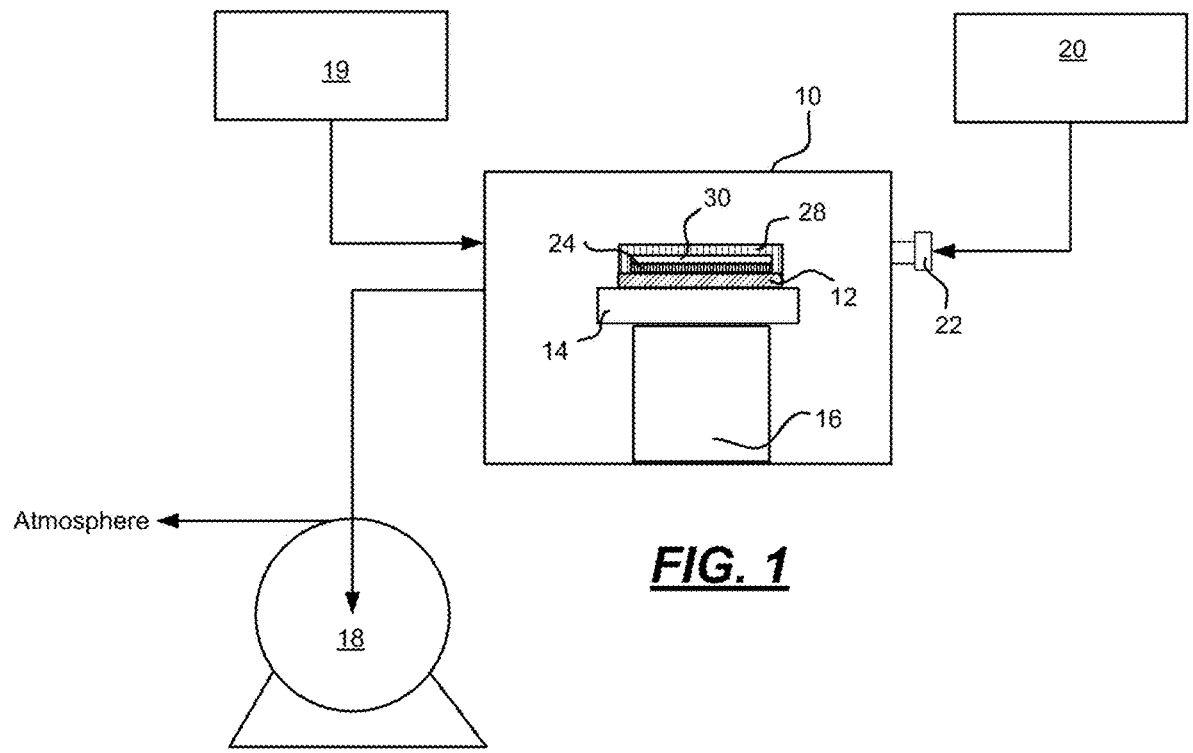
FIG. 1 is a schematic illustration of an apparatus that may be used to produce thin films of black phosphorus according to embodiments of the invention.

In accordance with embodiments of the invention, methods are provided for producing thin films of black phosphorus on a substrate to provide a crystalline thin film of black phosphorus that is suitable for semiconductor device purposes. As described in more detail below, the substrate may be selected from a wide variety of materials and the process steps used to make the black phosphorus thin film is dependent on the particular substrate that is used. In some embodiments, the substrate is selected from (i) a gold substrate, a gold-tin alloy substrate, a silver substrate and a copper substrate, (ii) a substrate comprising a thin film of metal selected from gold, tin, silver, copper and alloys of the foregoing metals, and (iii) a wafer selected from silicon, glass, ceramic, or insulating material. When a metal or metal thin film is used, a reactive metal is desirably used in order to form a metal phosphide intermediate composition. Particularly suitable metals or metal films include, but are not limited to gold, gold-tin alloys, silver, copper, and the like.

A metal phosphide intermediate composition may be formed with the foregoing metals, by heating the metal to a temperature above about 300° to about 500° C. in a deposition chamber and flowing a phosphorus gas over the heated metal. In other embodiments, a metal phosphide may be formed on a substrate by any method known to those skilled in the art, such as by sputtering, chemical vapor deposition, or by spraying or spin coating metal phosphide on the substrate. In some embodiments, red phosphorus or violet phosphorus from a red or violet phosphorus vapor is deposited on a substrate which may be selected from a metal substrate and an insulating substrate. The red or violet phosphorus may be converted to crystalline black phosphorus thin film by capping and heating the substrate and phosphorus to a temperature ranging from about 500° C. to less than about 1000° C. in the presence of $PH_3$ and $H_2$ until the red or violet phosphorus is converted into the crystalline black phosphorus thin film.

On metal substrates such as gold, tin, silver, copper and alloys of the foregoing metals, or substrates containing a thin layer or film of gold, gold-tin alloy, silver or copper, a phosphorus intermediate composition will directly form, while on other inert substrates, such as sapphire, Si, $SiO_2$, etc., red, violet, or white phosphorus or metal phosphide layers may be deposited. For example, $Au_2P_3$ may be formed by flowing a phosphorus precursor (like phosphine) or a phosphorus vapor across the gold-containing substrate at a temperature between about 350° C. and 500° C. Gold phosphide may be decomposed to crystalline black phosphorus by heating the phosphide material to a temperature of greater than 500° C. to less than about 1000° C. for a period of time sufficient to convert all of the gold phosphide into crystalline black phosphorus. In some embodiments, a capping material, as described below, may be used to cover the phosphide material during the conversion step to black phosphorus.

With reference to FIG. 1, a reaction chamber 10 is shown for the production of thin film crystalline black phosphorus. In accordance with one embodiment, a substrate 12 is loaded onto a platen 14 in the reaction chamber 10. The substrate 12 may be loaded into the reaction chamber 10 through a door in the chamber 10. In one embodiment, a load lock and substrate transfer fork is used to transfer the substrate wafer 10 into the reaction chamber 10 through the door. The platen 14 may be heated and/or cooled during the deposition and reaction process. The platen 14 is situated on a movable substrate holder 16 in the reaction chamber 10. A vacuum pump 18 is in gas flow communication with the reaction chamber 10 so that an inert purge gas source 19 may be used to flush oxygen and water vapor out the reaction chamber 10 and prevent unwanted side reactions.

In some embodiments, the substrate in the reaction chamber is heated to a temperature suitable for reaction of a metal with a phosphorus vapor. In other embodiments, the substrate is cooled to condense a metal phosphide compound on the substrate. In still other embodiments, phosphorus vapors are formed and deposited on a heated or cooled substrate. In order to react a phosphorus vapor with a metal layer on a substrate or react with a metal substrate, a phosphorus reactant or vapor may be injected into the reaction chamber 10 from an external phosphorus vapor generator 20, or an internal phosphorus generator. A carrier or purge gas from the inert purge gas source 19 may be constantly flowed through the system to sweep out the volatile reactant byproducts and excess phosphorus from the reaction chamber 10 during the phosphorus deposition process. The external phosphorus vapor generator 20 has an inlet 22 in gas flow communication with the reaction chamber 10 that allows phosphorus from the phosphorus vapor generator 20 to be deposited onto the substrate 12.

According to the invention, the phosphorus source material provided to the reaction chamber 10 by the phosphorus vapor generator 20 may be pure phosphorus such as red phosphorus, violet phosphorus or compounds of phosphorus that may be thermally cracked to produce a phosphorus vapor. Examples of phosphorus compounds that may be thermally cracked include, but are not limited to, phosphine and alkyl-phosphines such as tertiary-butyl-phosphine.

The phosphorus compounds may be thermally cracked using a hot wire assembly that is comprised of wire or ribbon of tantalum, tungsten, molybdenum, or rhenium. The wire may be heated by passing a DC or AC current through the wire as the phosphorus compound is passed through the hot wire assembly resulting in thermal cracking of the phosphorus compound into a di-phosphorus ($P_2$) vapor.

In an alternative embodiment, the substrate 12 and platen 14 may be heated to a temperature that causes the phosphorus compound to decompose on the surface of the substrate 12 so as to form an intermediate phosphorus composition with the substrate 12. In other embodiments, an intermediate phosphorus composition may be deposited on a substrate by means of sputtering, chemical vapor deposition or evaporation. In some embodiments, the intermediate phosphorus composition may be selected from $Au_2P_3$, $Au_3SnP_7$, $Au_7IP_{10}$, $AgP_2$, $CuP_2$.

An example of the use of this process is deposition of a phosphorus layer 24 on the substrate 12 using tertiary butyl phosphine as the phosphorus source. A tantalum hot wire assembly may be used to crack the tertiary butyl phosphine into a di-phosphorus ($P_2$) vapor stream that is then reacted with a gold, gold-tin alloy, silver or copper substrate 12 or a substrate containing a thin film of a gold, tin, silver, copper and alloys of the foregoing metals. Pre-cracking of the phosphorus reactant may enable the use of a lower substrate temperature that will be effective to prevent most of the phosphorus layer 24 from evaporating off of the wafer substrate 12.

In one version of the process for making thin film crystalline black phosphorus, conditions may be used to ensure most of the phosphorus layer 24 deposited on a substrate is of the red phosphorus or violet phosphorus type. In this version of the process, it is necessary to cap the red or violet phosphorus layer 24 with a capping material 28 prior to the heating step to convert the red or violet phosphorus to black phosphorus. The capping material 28 is suitably an inert capping material selected from, but not limited to, sapphire, quartz, glass, silicon, $Al_2O_3$, $HfO_2$, $SiO_2$, and the like. The capping material 28 is used to prevent or reduce evaporation of phosphorus from the from the red or violet phosphorus layer 24 during the thermal conversion process to black phosphorus. The capping material 28 is provided in close proximity to a surface of the phosphorus layer 24 to enclose the phosphorus layer 24 so that a minimum free volume 30 is provided between the phosphorus layer 24 and the capping material 28. Accordingly, the capping material 28 prevents evaporating phosphorus from leaving the immediate area adjacent to the substrate 12. In doing so, the phosphorus vapor can be recaptured by the capping material 28 so that the recaptured phosphorus vapor can be incorporated into the developing black phosphorus thin film on the surface of the substrate 12.

Figure 2:
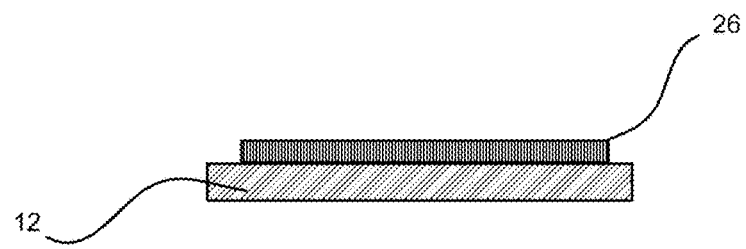
FIG. 2 is a schematic view, not to scale, of a thin film black phosphorus on a metal substrate produced by an embodiment of the invention.

Regardless of the substrate and process conditions, once a sufficient thickness of phosphorus or phosphorus composition 24 has been deposited on the surface of the wafer substrate 12, the phosphorus or phosphorus composition 24 may be subjected to a heating step or to a thermal cycle process to convert the phosphorus or phosphorus composition 24 into the desired phosphorus thin film 26 as shown in FIG. 2. If a thermal cycle process is used, the thermal cycle may include heating the phosphorus or phosphorus composition 24 to a temperature ranging from about 350° C. to about 400° C., then cooling the phosphorus intermediate composition 24 to a temperature in the range of from about 200° C. to about 240° C. and repeating the cycle at least about three times until all of the phosphorus or phosphorus composition 24 is converted to a black phosphorus thin film. During the thermal cycle process, it may be necessary to keep a flow of phosphorus vapor into the reaction chamber to prevent the phosphorus from evaporating from the film.

In some embodiments, the intermediate composition 24 is heated to a temperature ranging from greater than 500° C. to less than about 600° C. to convert the intermediate composition 24 into a crystalline black phosphorus thin film 26 with or without the use of the capping material 28. Intermediate compositions that may be directly converted into the black phosphorus thin film without thermal cycling include, but are not limited to, $Au_2P_3$, $Au_3SnP_7$, $Au_7IP_{10}$, $AgP_2$, $CuP_2$.

Once the black phosphorus thin film 26 has been formed, the capping material 28, if used, may be removed from the thin film 26 and substrate 12.

In another embodiment, a Molecular Beam Epitaxial (MBE) system with a phosphorus vapor generator assembly may be used to produce phosphorus layers or phosphorus compositions on the substrate 12. The MBE system is similar to a chemical vapor deposition (CVD) system and is comprised of a deposition chamber, substrate holder, and substrate heater. However, MBE system can also have a phosphorus vapor generator and a vacuum pump to keep the system at low pressures during the phosphorus deposition step. The MBE chamber may be equipped with a reflection high-energy electron diffraction (RHEED) system that allows the phosphorus being deposited onto the surface to be monitored. The RHEED system not only monitors how many monolayers per second are being deposited but can also identify the crystallographic properties of the depositing layers. The ability to monitor how many monolayers are deposited is important since the band gap of a phosphorene layer is dependent on how many layers are in the film.

Figure 3:
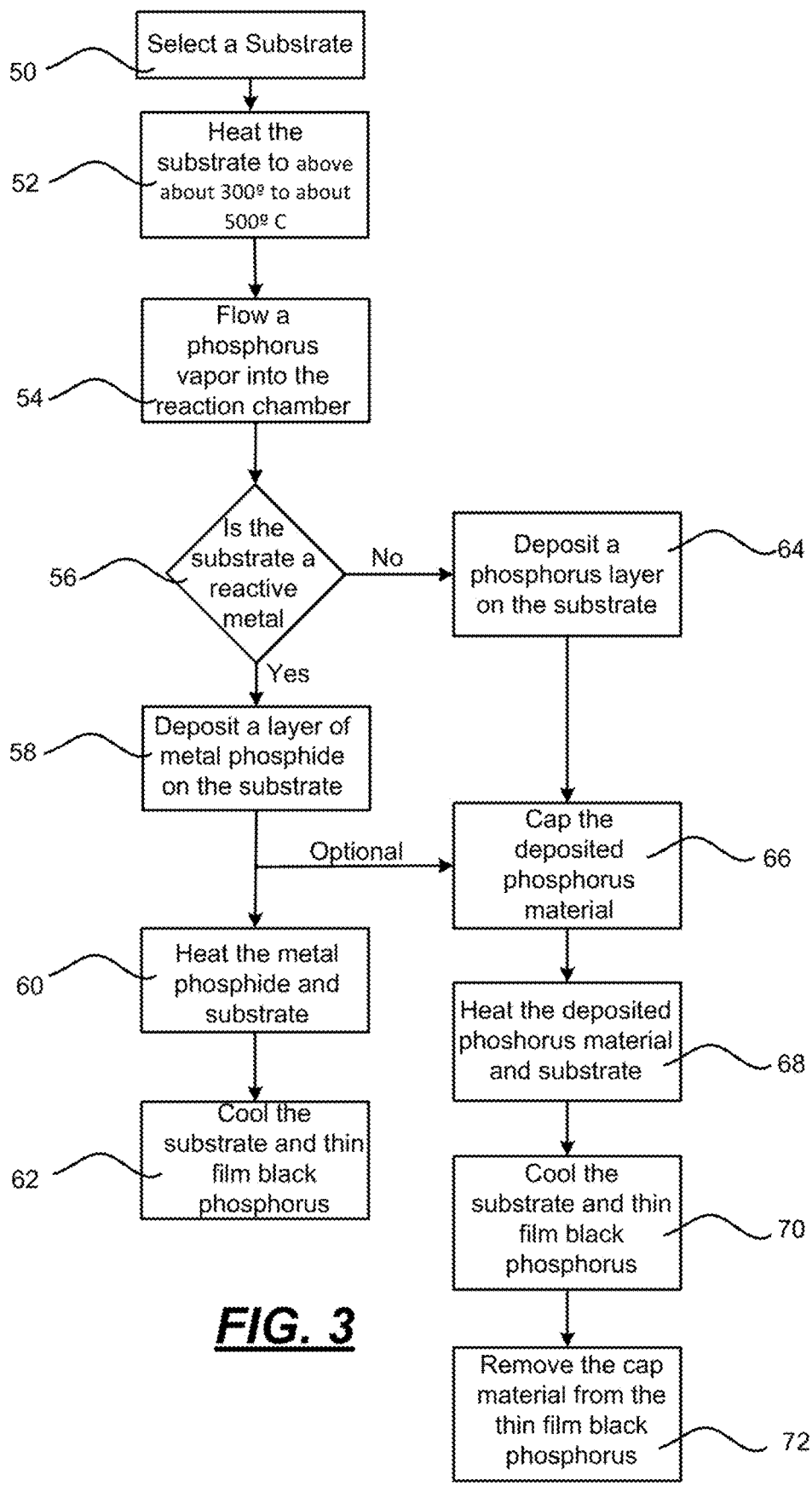
FIG. 3 is a flow diagram of a process for producing thin film crystalline black phosphorus on a substrate.

A simplified flow diagram for processes for making thin film crystalline black phosphorus are illustrated in FIG. 3. In the first step of the process 50, a suitable substrate is selected for depositing the phosphorus thereon. As set forth above, the substrate may be a reactive metal substrate or an insulating type substrate. In some embodiments, the substrate is heated in step 52 to a temperature ranging from about 300° to about 500° C. and a phosphorus vapor is flowed into the reaction chamber in step 54. If the substrate is a reactive metal substrate as determined in step 56, a metal phosphide layer is deposited on the substrate (step 58). In other embodiments, as described above, a metal phosphide layer may be sputtered or spin coated onto a cooled substrate. The metal phosphide is then heated to a temperature in step 60 sufficient to convert the metal phosphide from step 58 into a thin film of crystalline black phosphorus that is then cooled along with the substrate in step 62.

If the substrate is not a reactive metal substrate as determined in step 56, then a phosphorus layer from the phosphorus vapor is deposited on the substrate in step. A capping material is applied to the deposited phosphorus material or, optionally, to the metal phosphide material on the substrate in step 66. The deposited phosphorus material and substrate are heated in step 68 to form the thin film of crystalline black phosphorus and the substrate and thin film black phosphorus are cooled in step 70. Finally, the capping material is removed from the thin film black phosphorus and substrate in step 72.

The following non-limiting examples are presented as illustrations of processes that may be used to produce crystalline black phosphorus thin films according to embodiments of the invention.

EXAMPLE 1

Figure 4:
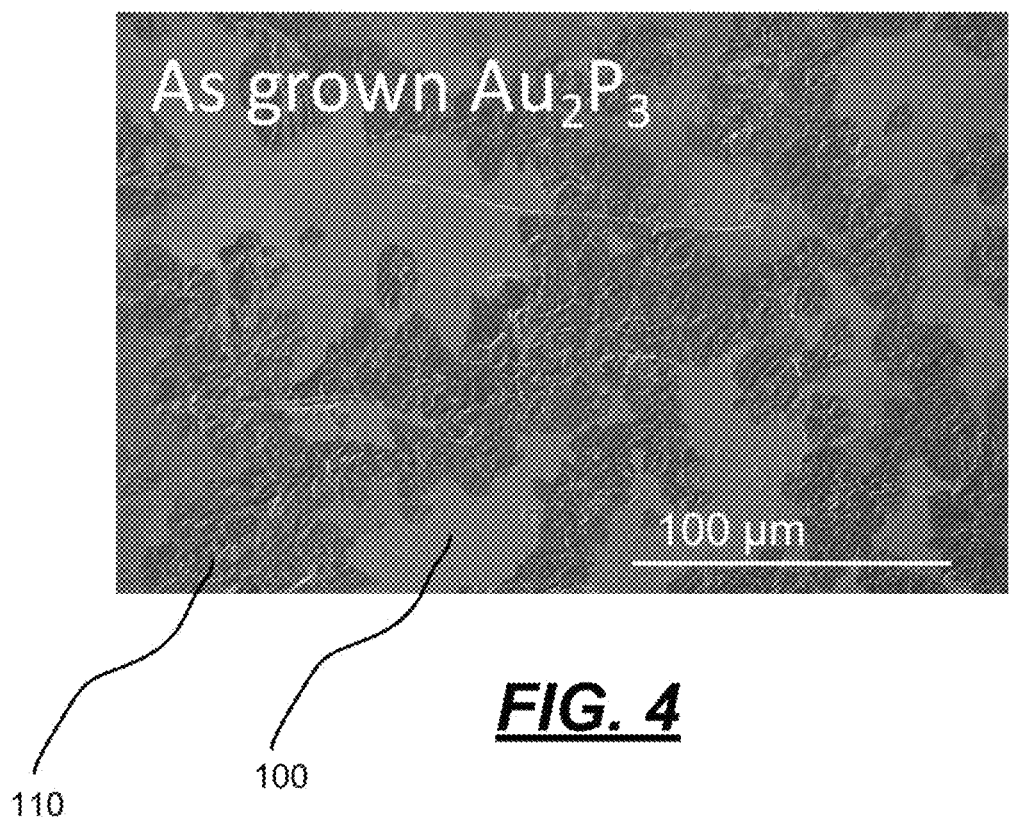
FIG. 4 is a photomicrograph of a gold film containing $Au_2P_3$ deposited thereon.
Figure 5:
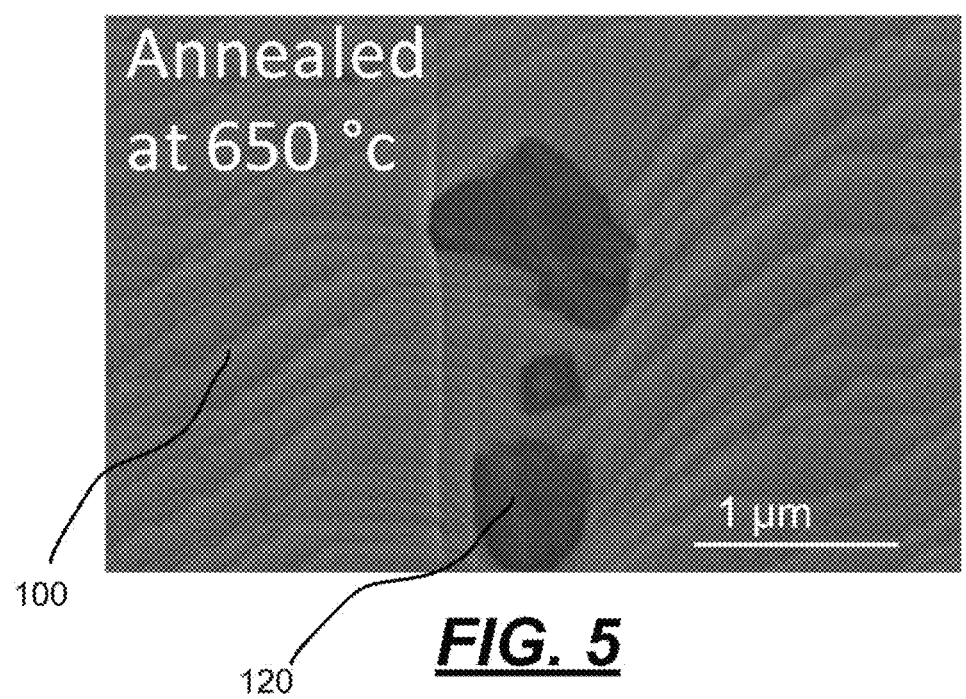
FIG. 5 is a photomicrograph of a portion of the gold film of FIG. 4 containing crystalline black phosphorus islands made from the $Au_2P_3$.

An insulating substrate wafer containing a gold foil film 100 (FIG. 4) was inserted into a vapor deposition chamber. The deposition chamber was purged with nitrogen and the substrate and gold foil film were heated to 400° C. A flow of phosphine gas was introduced into the reaction chamber at a rate of 100 standard cubic centimeters (sccm) at a pressure of about one atmosphere until a film of $Au_2P_3$ 110 was formed having a thickness of about 50 nanometers on the gold foil as shown in FIG. 4. The $Au_2P_3$ layer was then annealed at a temperature ranging from greater than 500° C. to about 650° C. under a flow of phosphine and hydrogen at one atmosphere of pressure until the $Au_2P_3$ decomposed to form islands 120 of crystalline black phosphorus film on the gold foil film 100 as shown in FIG. 5. During the annealing process most of the phosphorus desorbed from the $Au_2P_3$ layer 110 resulting in a low yield of black phosphorus film 120. Capping of the $Au_2P_3$ layer 110 is expected to significantly increase the yield of crystalline black phosphorus 120.

EXAMPLE 2

A polished silicon wafer with a size of 8 cm by 8 cm and a thickness of 0.2 cm is ultrasonically cleaned in absolute ethanol for 15 min to remove surface impurities. The wafer is then dried and placed horizontally in a heating zone in a reaction chamber. Red phosphorus powder is weighed into an alumina ceramic boat and placed in a heating zone of a vaporization chamber. The vaporization chamber is evacuated and argon gas is introduced into the vaporization chamber at a flow rate of 3 L/min to flow red phosphorus vapor into the reaction chamber for deposit of red phosphorus film on the silicon wafer. The red phosphorus film is then covered with an inert capping material and the silicon wafer is heated to a temperature ranging from above about 500° C. to about 650° C. to convert the red phosphorus film into a crystalline black phosphorus film. The capping material is removed from the black phosphorus film to yield a silicon wafer containing a layer of crystalline black phosphorus thin film.

The crystalline black phosphorus film that may be made by the processes described herein may be used as semiconductor materials or for use in making optical detectors. Additionally, the crystalline black phosphorus film, as described herein may extended to other electronic and/or semiconductor applications with similar requirements for thin film deposition of a black phosphorus coating.

It is noted that, as used in this specification and the appended claims, the singular forms "a," "an," and "the," include plural referents unless expressly and unequivocally limited to one referent. As used herein, the term "include" and its grammatical variants are intended to be non-limiting, such that recitation of items in a list is not to the exclusion of other like items that can be substituted or added to the listed items For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

The invention claimed is:

1. A low pressure process for producing thin film crystalline black phosphorus on a substrate comprising:
    flowing a phosphorus-containing gas into a deposition chamber, wherein the phosphorus-containing gas is selected from the group consisting of phosphine, and alkyl-phosphine,
    depositing phosphorus from the phosphorus-containing gas onto the substrate in the deposition chamber and heating the substrate and phosphorus to a temperature ranging from about 350° to less than about 500° C. to form a phosphorus intermediate composition, wherein the substrate is selected from the group consisting of (i) a gold substrate, a gold-tin alloy substrate, a silver substrate and a copper substrate and (ii) a substrate comprising a thin film of metal selected from the group consisting of gold, tin, silver, copper and alloys of the foregoing metals,
    heating the substrate and phosphorus intermediate composition to a temperature of greater than 500° C. to less than about 1000° C. convert the phosphorus intermediate composition to an orthorhombic black phosphorus thin film on the substrate.

2. The process of claim 1, wherein the deposition chamber is a chemical vapor deposition chamber.

3. The process of claim 1, wherein the phosphorus-containing gas is a di-phosphorus vapor.

4. The process of claim 1, wherein the substrate is selected from the group consisting of a gold foil, a gold-tin alloy foil, and an insulating substrate containing a thin film layer of gold or gold-tin alloy.

5. The process of claim 1, wherein the phosphorus intermediate composition is selected from the group consisting of $Au_2P_3$, $Au_3SnP_7$, $Au_7IP_{10}$, $AgP_2$, $CuP_2$.

6. A low pressure process for producing thin film crystalline black phosphorus on a substrate comprising:
    flowing a phosphorus-containing gas into a deposition chamber,
    depositing phosphorus from the phosphorus-containing gas onto the substrate in the deposition chamber and heating the substrate and phosphorus to a temperature ranging from about 350° to less than about 500° C. to form a phosphorus intermediate composition, wherein the substrate is selected from the group consisting of (i) a gold substrate, a gold-tin alloy substrate, a silver substrate and a copper substrate and (ii) a substrate comprising a thin film of metal selected from the group consisting of gold, tin, silver, copper and alloys of the foregoing metals,
    capping the phosphorus intermediate composition,
    heating the substrate and phosphorus intermediate composition, in the presence of $PH_3$ and $H_2$ to a temperature of greater than 500° C. to less than about 1000° C. to convert the phosphorus intermediate composition to an orthorhombic black phosphorus thin film on the substrate.

7. The process of claim 6, wherein the capping material is selected from the group consisting of sapphire, quartz, glass, silicon, $Al_2O_3$, $HfO_2$, and $SiO_2$.

8. A low pressure process for producing thin film crystalline black phosphorus on a substrate comprising:
depositing a metal phosphide on a substrate in a deposition chamber, wherein the metal phosphide is deposited using a process selected from the group consisting of evaporation, chemical vapor deposition and sputtering and wherein the metal is selected from the group consisting of gold, tin, silver, copper and alloys of the foregoing metals,
capping the metal phosphide with a non-reactive capping material,
heating the metal phosphide to a temperature of from above 500° C. to less than about 1000° C. to form thin film black phosphorus on the metal, and removing the capping material after the heating step.

9. The process of claim 8, wherein the capping material is selected from the group consisting of sapphire, quartz, glass, silicon, $Al_2O_3$, $HfO_2$, and $SiO_2$.

10. A low pressure process for producing thin film crystalline black phosphorus on a substrate comprising:
heating the substrate to a temperature ranging from about 300° to about 500° C. in a deposition chamber,
generating a phosphorus-containing gas from a phosphorus source,
flowing the phosphorus-containing gas into the deposition chamber to form a phosphorus layer on the substrate,
capping the phosphorus layer on the substrate with an inert capping material,
heating the phosphorus layer to a temperature from above about 500° C. to less than about 1000° C. at a pressure of from about atmospheric pressure to about 100 mTorr to convert the phosphorus layer to an orthorhombic black phosphorus thin film on the substrate.

11. The process of claim 10, wherein the capping material is selected from the group consisting of sapphire, quartz, glass, silicon, $Al_2O_3$, $HfO_2$, and $SiO_2$.

12. The process of claim 10, wherein the phosphorus source is selected from the group consisting of red phosphorus, violet phosphorus, phosphine, alkyl-phosphine.

13. The process of claim 10, wherein the substrate is selected from the group consisting of (i) a gold substrate, a gold-tin alloy substrate, a silver substrate and a copper substrate, (ii) a substrate comprising a thin film of metal selected from the group consisting of gold, tin, silver, copper and alloys of the foregoing metals, and (iii) a wafer selected from silicon, glass, and ceramic.

* * * * *